(12) United States Patent
Nittoor

(10) Patent No.: US 11,955,988 B2
(45) Date of Patent: Apr. 9, 2024

(54) SYSTEM AND METHOD FOR GENERATION OF ERROR-CORRECTING CODES IN COMMUNICATION SYSTEMS

(71) Applicant: Vivek Sathyanarayana Nittoor, Bengaluru (IN)

(72) Inventor: Vivek Sathyanarayana Nittoor, Bengaluru (IN)

(73) Assignee: Vivek Sathyanarayana Nittoor

( * ) Notice: Subject to any disclaimer, the term of this patent is extended or adjusted under 35 U.S.C. 154(b) by 204 days.

(21) Appl. No.: 16/066,915

(22) PCT Filed: Dec. 27, 2016

(86) PCT No.: PCT/IN2016/000295
§ 371 (c)(1),
(2) Date: Jun. 28, 2018

(87) PCT Pub. No.: WO2017/115380
PCT Pub. Date: Jul. 6, 2017

(65) Prior Publication Data
US 2020/0169270 A1 May 28, 2020

(30) Foreign Application Priority Data
Dec. 28, 2015 (IN) ............................ 7003/CHE/2015

(51) Int. Cl.
*H03M 13/11* (2006.01)
*H03M 13/29* (2006.01)
*H04L 1/00* (2006.01)

(52) U.S. Cl.
CPC ... *H03M 13/1148* (2013.01); *H03M 13/2912* (2013.01); *H04L 1/0041* (2013.01); *H04L 1/0057* (2013.01)

(58) Field of Classification Search
CPC ......... H03M 13/1148; H03M 13/2912; H03M 13/033; H03M 13/6516; H03M 13/1102; H04L 1/0057; H04L 1/0041; H04L 1/00; G06F 11/07
USPC .......................................... 714/752
See application file for complete search history.

(56) References Cited

U.S. PATENT DOCUMENTS

| | | | | |
|---|---|---|---|---|
| 7,805,652 B1 * | 9/2010 | Varnica | ................ | H03M 13/116 |
| | | | | 714/752 |
| 8,607,125 B2 * | 12/2013 | Xu | ........................ | H03M 13/118 |
| | | | | 714/774 |
| 8,689,093 B2 * | 4/2014 | Myung | ................ | H03M 13/036 |
| | | | | 714/806 |
| 11,689,223 B2 * | 6/2023 | Aspuru-Guzik | ....... | G06N 10/70 |
| | | | | 714/752 |

(Continued)

FOREIGN PATENT DOCUMENTS

CN 101242188 B * 5/2011

*Primary Examiner* — Guy J Lamarre
*Assistant Examiner* — Enam Ahmed
(74) *Attorney, Agent, or Firm* — Joy S. Goudie; Goudie, PLLC

(57) ABSTRACT

The embodiments herein provide a system and method for generating a catalog of graphs that acts as a source for creating error correcting codes. A D3 chord index notation is used to describe the graphs. A list of (3, g) Hamiltonian graphs for even girth g is created to satisfy the condition $6 \leq g \leq 16$. Each of the lists is infinite and is used for creating LDPC codes of high quality.

4 Claims, 4 Drawing Sheets

(56) References Cited

U.S. PATENT DOCUMENTS

| | | | | |
|---|---|---|---|---|
| 2003/0069908 A1* | 4/2003 | Anthony | G06F 16/258 | 715/251 |
| 2004/0165681 A1* | 8/2004 | Mohan | H04L 27/001 | 375/322 |
| 2005/0175276 A1* | 8/2005 | Hashizume | G02B 6/2938 | 385/24 |
| 2005/0204253 A1* | 9/2005 | Sukhobok | H03M 13/118 | 714/752 |
| 2005/0220302 A1* | 10/2005 | Mironov | H04L 9/0894 | 380/42 |
| 2006/0242530 A1* | 10/2006 | Lu | H03M 13/1197 | 714/752 |
| 2007/0136635 A1* | 6/2007 | Niu | H03M 13/116 | 714/752 |
| 2007/0162815 A1* | 7/2007 | El-Khamy | H03M 13/618 | 714/752 |
| 2007/0260772 A1* | 11/2007 | Garmonov | H03M 13/27 | 710/33 |
| 2008/0028274 A1* | 1/2008 | Lin | H03M 13/1171 | 714/752 |
| 2008/0071849 A1* | 3/2008 | Krieger | G06Q 10/04 | 708/520 |
| 2008/0180247 A1* | 7/2008 | Deoalikar | G06K 7/0008 | 340/572.1 |
| 2009/0196361 A1* | 8/2009 | Chan | H04L 1/0045 | 375/260 |
| 2009/0241013 A1* | 9/2009 | Roetteler | H03M 13/19 | 714/752 |
| 2010/0014675 A1* | 1/2010 | Sniffen | H04L 9/3218 | 380/277 |
| 2012/0084617 A1* | 4/2012 | Djordjevic | H04L 1/0057 | 714/752 |
| 2013/0139025 A1* | 5/2013 | Gioulekas | H03M 13/6583 | 714/752 |
| 2013/0238951 A1* | 9/2013 | Guha | H04B 10/70 | 714/752 |
| 2014/0053038 A1* | 2/2014 | Petyushko | H03M 13/1102 | 714/752 |
| 2018/0323801 A1* | 11/2018 | Hsu | H03M 13/6516 | |

* cited by examiner

SYSTEM AND METHOD FOR GENERATION OF ERROR-CORRECTING CODES IN COMMUNICATION SYSTEMS

CROSS-REFERENCE TO RELATED APPLICATIONS

The embodiments herein claims the priority of the Indian Provisional Patent Application filed on Dec. 28, 2015 and with the number 7003/CHE/2015 and entitled, "A CATALOGUE OF (3, g) HAMILTONIAN BIPARTITE GRAPHS AS A SOURCE FOR ERROR-CORRECTION CODES", and the contents of which are included in entirety as reference herein. The present application is filed as a national phase application filed in consequence/continuation of the PCT application with serial number PCT/IN2016/000295 filed on Dec. 27, 2016 with the tile and the contents of which are included entirely as reference herein.

BACKGROUND

Technical Field

The embodiments herein are generally related to graph theory. The embodiments herein are particularly related to representation of graphs. The embodiments herein are more particularly related to generating graphs as a source for creating error-correction codes.

Description of the Related Art

In the field of mathematics and computer science, graph theory refers to the study of graphs. The study and the implementation of graphs are used in various fields including electrical engineering (communications networks and coding theory), computer science (algorithms and computations), biochemistry (genomics), and operation research (scheduling), and the like.

One of the important applications of the graph theory is in error correcting codes. Error correcting codes are techniques that enable reliable delivery of digital data over unreliable communication channels. The communication channels are generally subject to channel noise, and thus errors are introduced during transmission from a source to a receiver. The error correction enables reconstruction of the original sent data in many cases.

It is evident from the above discussion that the creation of error codes is necessary and important in the field of communication. There are a plurality of methods for creating error correction codes. One of the methods for creating error correction codes is by using graph theory.

The conventional methods for creating error correction codes include using Low Density Parity Check (LDPC) codes, Turbo Codes, and the like. However, the conventional method for creating error correction codes such as LDPC codes has difficulty in finding graph of high girth. Further, the conventional methods for generating new lists of graphs do not include the smallest graph for a particular even girth, especially for higher even girth.

A (3, g) graph is a simple and undirected graph of regular degree 3 with girth g. The prior art has a difficulty of finding trivalent graphs of large girth beyond or outside the vertex-transitive class. For example, the (3, 14) vertex-transitive graph with a minimum order of 406 was found by Hoare in 1981 and described in Hoare 1983 and Biggs 1989, and it was only in 2002, that a (3, 14) record graph with record graph with order 384 was found by Exoo 2002 outside the class of vertex-transitive graphs, using a sophisticated voltage graph construction technique. The present disclosure aims to solve this difficulty by generating a large number of (3, g) Hamiltonian Bipartite graphs (HBG) for even girth g, with a lot of graphs outside the vertex-transitive class.

The prior art lists a very limited number of graphs of high girth, given that the number of non-isomorphic trivalent graphs for orders greater than 32 is extremely large.

Hence, there is a need for a method and system for generating a catalog of graphs, which act as a source for creating error correcting codes. Still further, there is a need for a method and system for providing an increased supply of plurality of graphs of high girth.

The above-mentioned shortcomings, disadvantages and problems are addressed herein and which will be understood by reading and studying the following specification.

OBJECTIVES OF THE EMBODIMENTS HEREIN

The various embodiments herein provide a method and system for generating a catalog of graphs that acts as a source for creation of error correcting codes.

The primary object of the embodiments herein is to develop a system and method for providing a catalog of (3, g) Hamiltonian Bipartite graphs (HBG) as a source for creating error-correcting codes.

Another object of the embodiments herein is to provide a system and method for generating a catalog of (3, g) graphs for a girth g, which is used for creation of the error-correction codes.

Yet another object of the embodiments herein is to develop a system and method for providing a new source of a plurality of graphs that dramatically increases the supply of graphs of high girth (orders greater than 32).

Yet another object of the embodiments herein is to develop a system and method for generating a catalog of graphs of various orders (number of vertices), which is further used to creating a catalog of Low Density Parity Check (LDPC) codes for various parameters (examples of parameters include size of matrix, regular or irregular degree, girth and the like)

Yet another object of the embodiments herein is to develop a system and method for generating a list a plurality of non-isomorphic trivalent graphs for greater orders (orders greater than 32).

Yet another object of the embodiments herein is to provide a system and method to ease the process of finding the trivalent graphs of large girth.

Yet another object of the embodiments herein is to provide a system and method for generating a list of graphs that includes the smallest known (3, g) graphs.

Yet another object of the embodiments herein is to provide a system and method for providing to analyse the resulting graph listing.

Yet another object of the embodiments herein is to provide a system and method for generating Hamiltonian Bipartite graphs with a higher value of even girths greater than 6 and with higher values of even girth up to 16 and above.

Yet another object of the embodiments herein is to provide a system and method for generating Hamiltonian Bipartite graphs for various symmetry factors of b for orders of 2m such that m is a multiple of b.

These and other objects and advantages of the embodiments herein will become readily apparent from the following detailed description taken in conjunction with the accompanying drawings.

SUMMARY

The various embodiments herein provide a system and method for generating a catalog of (3, g) Hamiltonian Bipartite graphs as a source for creating error-correction codes. The error correction codes thus created are implemented in communication systems and related contexts. The embodiments herein generates a catalog of graphs of various orders (number of vertices) which is further used create a catalog of LDPC (Low Density Parity Check) codes for various parameters. The various parameters include size of matrix, degree, girth, and the like (A parity check matrix is an r-row by n column binary matrix, where k=n-r. The percentage of 1's in the parity check matrix for a LDPC code is low). Thus, the embodiments herein provide graphs of high girth for creating LDPC codes.

According to an embodiment herein, the system provides a result on existence of a (3, g) Hamiltonian Bipartite graph for each order for which (3, g) vertex-transitive graphs exist, whether Bipartite or non-Bipartite for chosen intervals of comparison for even girth until g=14. For comparison with vertex-transitive graphs, (3, 6) graphs until order 50, (3, 8) graphs until order 90, (3, 10) graphs until order 160, (3, 12) graphs until order 400 and (3, 14) graphs until order 1000 are analysed. According to an embodiment herein, the system provides detailed information on existence of (3, g) Hamiltonian Bipartite graphs for each order, with symmetry factors for which graphs have been found, symmetry factors for which graphs have been proven not to exist, and symmetry factors for which the existence of the graph have been found to be inconclusive. This analysis for various symmetry factors for each order, displays the strength of generated list of (3, g) Hamiltonian Bipartite graphs.

A D3 chord index notation is used to describe the graphs. The present disclosure lists a (3, g) Hamiltonian Bipartite graphs for even a girth g, to satisfy the limitation of 6≤g≤16. The method for generating lists of (3, g) Hamiltonian Bipartite graphs is more general and is also applicable for even girth g having the value greater than 16. According to an embodiment herein, each of the lists is infinite. The generated graphs are used for creating the LDPC codes of high quality.

According to an embodiment herein, the list of (3, g) graphs for even girth g has graphs that are not-vertex transitive for many orders. The list is created even for the smallest known (3, g) graphs. Further, the generated list covers a class of graphs which are more general than the class of vertex-transitive graphs. According to an embodiment herein, the appropriate graphs for the listing are identified such that (3, g) graph of minimum order within the class is also the smallest known (3, g) graph.

According to an embodiment herein, at first, a list of (3, g) Hamiltonian Bipartite graphs is generated for each order until order $2^{3g/4}$. According to an embodiment herein, a computation approach is used for finding and listing (3, g) Hamiltonian Bipartite graphs for even a girth g over a wide range of orders until $2^{3g/4}$, and hence a (3, g) Hamiltonian Bipartite graph with the minimum order is found.

According to an embodiment herein, the catalogs are generated for Hamiltonian Bipartite graphs of even orders and regular degrees while the catalogs of LDPC codes are created for both the regular and irregular degrees.

According to an embodiment herein, a system and method are provided for generating Hamiltonian Bipartite graphs with a higher value of even girths greater than 6 and can also support higher values of even girth up to 16 and above.

According to an embodiment herein, a system and method are provided for generating Hamiltonian Bipartite graphs for various symmetry factors of b for orders of 2m such that m is a multiple of b.

These and other aspects of the embodiments herein will be better appreciated and understood when considered in conjunction with the following description and the accompanying drawings. It should be understood, however, that the following descriptions, while indicating the preferred embodiments and numerous specific details thereof, are given by way of an illustration and not of a limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Figure 1:
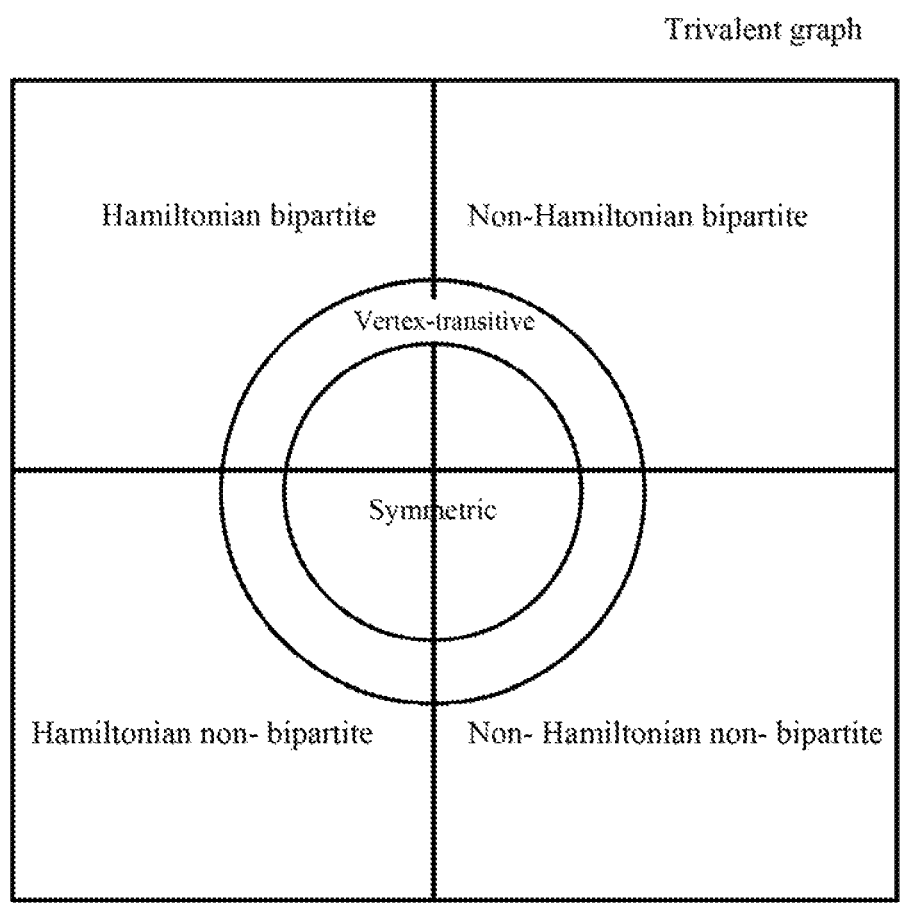
FIG. 1 illustrates a general Hamiltonian Bipartite graph of minimum order for even girth g, according to one embodiment herein.

Although the specific features of the embodiments herein are shown in some drawings and not in others. This is done for convenience only as each feature may be combined with any or all of the other features in accordance with the embodiments herein.

DETAILED DESCRIPTION OF THE EMBODIMENTS

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The various embodiments herein provide a method and system for generating a catalog of graphs that acts as a source for creating error correcting codes.

A D3 chord index notation is used to describe the graphs. The present disclosure lists a (3, g) Hamiltonian Bipartite graphs for even girth g, satisfying the condition 6≤g≤16. The method for generating lists of (3, g) Hamiltonian Bipartite graphs is more general and is also applicable for even girth g having the value greater than 16. According to an embodiment herein, each list is infinite. The graphs generated are used for creating the LDPC codes of high quality.

According to an embodiment herein, the methods are used for generating a large number of non-isomorphic trivalent graphs for orders greater than 32.

According to an embodiment herein, a new list of (3, g) graphs for even a girth g is generated to provide graphs that are not vertex-transitive for many orders.

According to an embodiment herein, a list of the smallest known (3, g) graphs is generated. Further, the created list covers graphs that are more general than the class of vertex-transitive graphs. According to an embodiment herein, the appropriate graphs for the list are identified such that (3, g) graph of minimum order within the class is also defined as the smallest known (3, g) graph.

TABLE 1

Values of minimum order of Cayley and vertex-transitive graphs for even values of g ≥ 6 obtained from Potocnik P., Spiga P., and Verret G. Cubic vertex-transitive graphs on up to 1280 vertices. arXiv:1201.5317v1 [math.CO], and Potocnik P., Spiga P., and Verret G. Bounding the order of the vertex stabiliser in 3-valent vertex-transitive and 4-valent arc-transitive graphs. arXiv:1010.2546v1 [math.CO], and lower and upper bounds obtained from Exoo G. and Jajcay R. Dynamic cage survey. Electronic Journal of Combinatorics, 18(DS16), 2011.

| Girth g | $n_{Cayley}$ | $n_{Vertex\_transitive}$ | (3, g) Lower Bound | (3, g) Upper Bound |
|---|---|---|---|---|
| 6 | 14 | 14 | 14 | 14 |
| 8 | 30 | 30 | 30 | 30 |
| 10 | 96 | 80 | 70 | 70 |
| 12 | 162 | 162 | 126 | 126 |
| 14 | 406 | 406 | 258 | 384 |
| 16 | 1008 | 1008 | 512 | 960 |

According to an embodiment herein, a list of the graphs with higher orders and larger girths than that in the exiting list is generated with the graphs of many orders that lie outside the vertex-transitive class.

According to an embodiment herein, a plurality of subclasses is defined and a list one representative graph from each subclass (if the subclass is not empty) to enumerate all non-isomorphic graphs.

According to an embodiment herein, the graphs and the subclasses are defined for developing a practical algorithm for generating the graphs.

According to an embodiment herein, a resulting graph list is analysed. The analysis is a dynamic and continuous process to provide knowledge and methods in external graph theory.

According to an embodiment herein, every (3, g) Hamiltonian Bipartite graph of minimum order is also (3, g) cage for even girth g≤12. Hamiltonian trivalent Bipartite graphs represent one quadrant in the space of trivalent graphs as illustrated in the FIG. 1. According to an embodiment herein, the other three quadrants are the Hamiltonian non-Bipartite graphs, the non-Hamiltonian Bipartite graphs and the non-Hamiltonian non-Bipartite graphs. According to an embodiment herein, there are no known enumeration methods for trivalent graphs outside the set of vertex-transitive graphs.

According to an embodiment herein, a list of (3, g) Hamiltonian Bipartite graphs for each order is generated up to order $2^{3g/4}$. According to an embodiment herein, a computation approach is used for finding and listing (3, g) Hamiltonian Bipartite graphs for even a girth g over a range of orders up to $2^{3g/4}$, and hence a (3, g) Hamiltonian Bipartite graph with the minimum order is found.

According to an embodiment herein, the outcome of the listing of (3, g) Hamiltonian Bipartite graphs of orders up to $2^{3g/4}$ is as follows: An exhaustive list is generated to cover all orders in a specified range that have a (3, g) Hamiltonian Bipartite graph, with a proof for non-existence of graphs of the orders that are not listed.

A partial list results in the existence of (3, g) Hamiltonian Bipartite graph, for some orders in a specified range that are inconclusive.

According to an embodiment herein, the notation D3 refers to D3 chord indices $\{l_1, l_2, \ldots l_b\}$ for a Hamiltonian trivalent Bipartite graph with symmetry factor b and order 2m, where b divides m.

TABLE 2

Comparison of orders of (3, g) lists

| (3, g) graphs | Until order | Hamiltonian Bipartite | Vertex-transitive | Symmetric |
|---|---|---|---|---|
| (3, 6) | 50 | 19 | 19 | 10 |
| (3, 8) | 90 | 29 | 21 | 6 |
| (3, 10) | 160 | 29 | 15 | 7 |
| (3, 12) | 400 | 84 | 26 | 16 |
| (3, 14) | 1000 | 164 | 35 | 11 |

According to an embodiment herein, the Hamiltonian Bipartite graphs are identified as a promising class of trivalent graphs that lead to a listing of (3, g) graphs for even a girth g and list of generated graphs includes graphs for more orders than that present in the existing lists of graphs of high girth. Further the list is also expected to contain a (3, g) graph with minimum order. The embodiments herein provides the first known work to list Hamiltonian Bipartite graphs of specified even girths, and the first known enumeration method outside the class of trivalent vertex-transitive graphs such that the generated list has graphs for larger number of distinct orders than the existing lists. Still further the generated list includes the (3, g) cage for values of g equal to 6, 8, and 12, one (3, 10) cage and the (3, 14) record graph.

According to an embodiment herein, the list has (3, g) graphs for more orders compared to the existing lists. The result on existence of a (3, g) vertex-transitive graphs exist, whether Bipartite or non-Bipartite for chosen intervals of comparison with vertex-transitive graphs, the (3, 6) graphs are considered until order 50, (3, 8) graphs until order 90, (3, 10) graphs until order 160, (3, 12) graphs until order 400 and (3, 14) graphs until order 1000.

According to an embodiment herein, a detailed information on existence of (3, g) Hamiltonian Bipartite graphs for each other, with symmetry factors for which graphs have been found, symmetry factors for which graphs have been proven not to exist, and symmetry factors for which the existence of the graph have been found to be inconclusive. The embodiments herein provide an analysis for various symmetry factors for each order show the strength of the list of (3, g) Hamiltonian Bipartite graphs.

According to an embodiment herein, a large number of (3, g) graphs are available outside the vertex-transitive class. There are many orders for which a (3, g) vertex-transitive graph does not exist, for which (3, g) Hamiltonian Bipartite graph is provided in the present list.

According to an embodiment herein, the present list of (3, g) Hamiltonian Bipartite graphs are exhaustive with graphs for each order in specified range with proof of non-existence for orders of graphs not listed when g is equal to 6, 8 and partial for 10, 12, 14, and 16 due to some inconclusive results for some subclasses.

According to an embodiment herein, a symmetry factor for representing the level of rotational symmetry in Hamiltonian trivalent graphs. According to an embodiment herein, the symmetry factor allows decomposing the problem of listing (3, g) Hamiltonian Bipartite graphs of even girth g for a range of orders into sub-problems of listing (3, g) Hamiltonian Bipartite graphs for a specified symmetry factor b for a range of orders, and hence allows listing of (3, g) Hamiltonian Bipartite graphs for more orders.

According to an embodiment herein, a D3 chord index notation, which is twice as compact as LCF notation for representing Hamiltonian trivalent Bipartite graphs.

According to an embodiment herein, the D3 chord index notation can specify an infinite family of Hamiltonian Bipartite graphs that have the same girth g for orders greater than a threshold value.

For example, the D3 chord index "5" leads to a (3, 6) Hamiltonian Bipartite graph for all even orders greater than or equal to 14.

In another example, the D3 chord indices "15 53 73 139 243 267 471 651" leads to (3, 16) Hamiltonian Bipartite graphs for orders 2352+16i for integers i≥0, for symmetry factor 8. In addition, it also observed that the above mentioned D3 chord indices also lead to (3, 16) Hamiltonian Bipartite graphs for the orders 1824, 1840, 1936, 2016, 2032, 2112, 2144, 2160, 2176, 2240, 2256, 2272, 2288, 2304, and 2320.

According to an embodiment herein, the list of graphs is generated to provide lower bounds and upper bounds on minimum order for the existence of a (3, g) Hamiltonian Bipartite graph for a specified symmetry factor b for even girth g, with the lower bound being equal to the upper bound for a plurality of cases. For example, the corresponding lower bound and upper bounds are equal for symmetry factors 4, 5 and 6 for (3, 14) Hamiltonian Bipartite graphs.

According to an embodiment herein, a theoretical lower bound and empirical data for the minimum value of symmetry factor b is disclosed for a (3, g) Hamiltonian Bipartite graph for a range of even girth g. For example, the minimum value of symmetry factor for (3, 6) Hamiltonian Bipartite graphs is 1, and that for (3, 8) Hamiltonian Bipartite graphs is 2.

According to an embodiment herein, the results on non-existence of (3, g) Hamiltonian Bipartite graphs for some orders and symmetry factors shows that results in the emptiness of some subclasses of Hamiltonian Bipartite with a defined symmetry factor b and even girth g are of greater interest. For example, the lower bound is 258 and upper bound is 384 for (3, 14) graphs. It is shown the non-existence of (3, 14) Hamiltonian Bipartite graphs between orders 258 and 384 for symmetry factors 4, 5, 6 and emptiness of many other subclasses as per the non-existence list.

Figure 2:
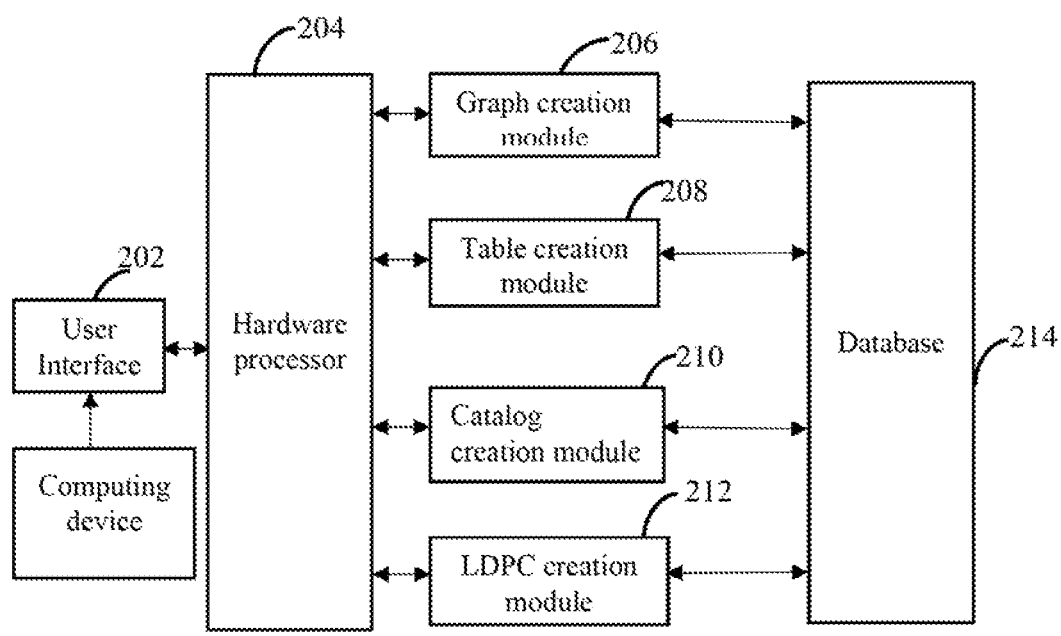
FIG. 2 illustrates a system for generating a catalog of graphs that acts as a source for creating error correcting codes, in accordance with an embodiment herein.

FIG. 2 illustrates a system for generating a catalog of graphs that acts as a source for creating error correcting codes, in accordance with an embodiment of the embodiments herein. The system generates a catalog of (3, g) graphs for even girth g. The catalog thus generated is used to create error-correction codes. The system generates a new source of graphs that dramatically increase the supply of graphs of high girth.

According to an embodiment herein, D3 chord index notation is used to describe the graphs. The system lists a catalog of (3, g) Hamiltonian Bipartite graphs for even girth g satisfying 6≤g≤16. The method for generating lists of (3, g) Hamiltonian Bipartite graphs is more general and is also applicable for even girth g having the value greater than 16.

Each of these lists is infinite. The generated graphs are used for creating the LDPC codes of high quality.

According to an embodiment herein, the system includes the user interface 202, the hardware processor 204, the graph creation module 206, the table creation module 208, the catalog creation module 210, the LDPC creation module 212, and database 214.

The user interface 202 such as touch screen display or keyboard enables a user to enter required parameters such as girth, symmetry factor, matrix and the like. The input parameters are transmitted to the hardware processor 204. The hardware processor 204 is configured to generate a catalog of (3, g) graphs for even girth g and further create error correction codes. The hardware processor 204 is configured to operate the graph creation module 206, the table creation module 208, the catalog creation module 210, and the LDPC creation module 212.

The graph creation module 206 is configured to generate trivalent graphs of large girth that are not necessarily vertex-transitive. The graph creation module 206 is configured to generate smallest known (3, g) graph and graphs that are more general than the class of vertex transitive graphs. Further, the graph creation module 206 generates graphs with larger number of orders and larger girths than the existing listings, with graphs outside the vertex-transitive class for many orders. Further, the graph creation module 206 is configured to generate a list of (3, g) Hamiltonian Bipartite graphs of specified even girth, outside the vertex-transitive class for many orders.

The table creation module 206 is configured to create a table of (3, g) Hamiltonian Bipartite graphs for a symmetry factor b, for different orders. Tables of order (3, 6) to (3, 16) are generated.

Further, the catalog creation module 210 generates a catalog of (3, g) Hamiltonian Bipartite graphs including a plurality of tables for various orders.

The LDPC creation module 212 creates a catalog of LDPC codes from a catalog of (3, g) Hamiltonian Bipartite graphs.

Figure 3:
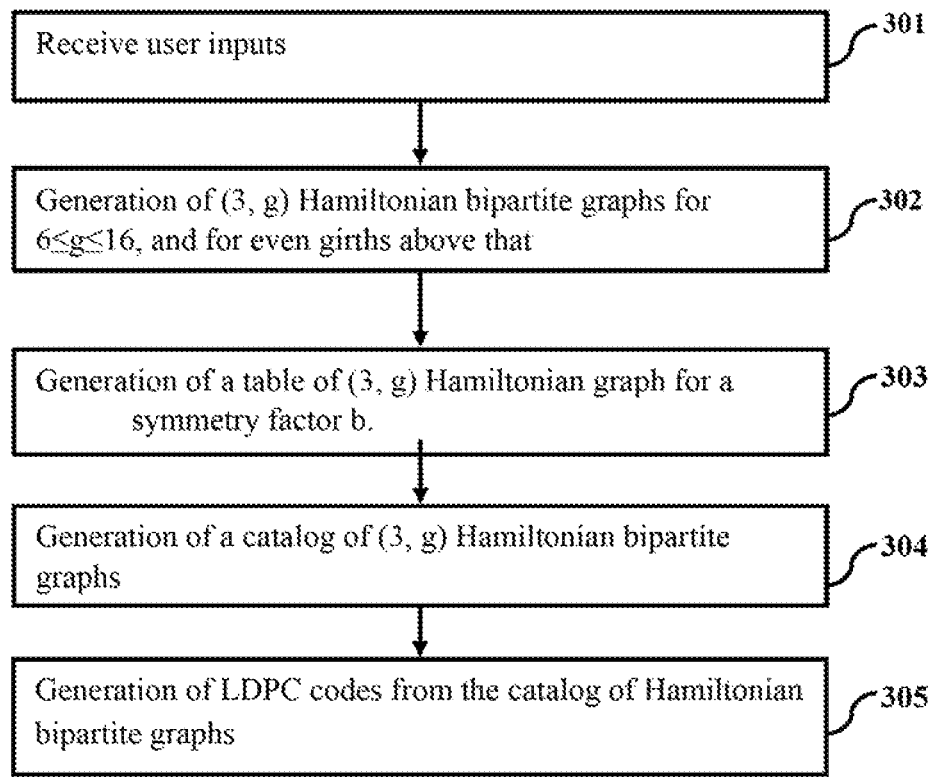
FIG. 3 is a flowchart illustrating a method for creation of error correction codes, in accordance with an embodiment herein.

FIG. 3 is a flowchart illustrating a method for creation of error correction codes, in accordance with an embodiment of the embodiments herein.

According to an embodiment herein, the method for creation of error correction codes includes receiving user input regarding graph parameters through a user interface on a computing device (301). Further, Hamiltonian Bipartite graphs for girth size 6≤g≤16 are generated (302) through a graph creation module. Subsequently, at least one (3, g) graph for each distinct order for even values of girth g is generated. Also, the smallest known (3, g) graph and graphs from a class more general than the vertex transitive graphs is generated by the graph creation module. Graphs with larger number of orders and larger girths than the existing listings outside the vertex-transitive class for many orders are generated by the graph creation module.

According to an embodiment herein, a table of (3, g) Hamiltonian graph for a symmetry factor, b is generated (303). The tables include lists of (3, g) Hamiltonian Bipartite graphs that are exhaustive with graphs for each order in specified range with proof of nonexistence for orders of graphs not listed for values of g equal to 6, 8 and partial for 10, 12, 14, and 16 due to some inconclusive results for some subclasses.

Further, a catalog of (3, g) Hamiltonian Bipartite graphs is generated (304). And a catalog of LDPC codes is created from the catalog of Hamiltonian Bipartite graphs. (305). Thus, the method includes generating a catalog of graphs of various orders (number of vertices) which is further used to create a catalog of LDPC (Low Density Parity Check) codes for various parameters. The various parameters include size of matrix, degree, girth, and the like.

According to an embodiment herein, the system provides a result on existence of a (3, g) Hamiltonian Bipartite graph for each order for which (3, g) vertex-transitive graphs exist, whether Bipartite or non-Bipartite for chosen intervals of comparison for even girth until g=14. For comparison with vertex-transitive graphs, (3, 6) graphs until order 50, (3, 8) graphs until order 90, (3, 10) graphs until order 160, (3, 12) graphs until order 400 and (3, 14) graphs until order 1000 are analysed. According to an embodiment herein, the system provides detailed information on existence of (3, g) Hamiltonian Bipartite graphs for each order, with symmetry factors for which graphs have been found, symmetry factors for which graphs have been proven not to exist, and symmetry factors for which the existence of the graph have been found to be inconclusive in the factor analysis tables. This analysis for various symmetry factors for each order, displays the strength of generated list of (3, g) Hamiltonian Bipartite graphs.

According to an embodiment herein, the catalogs are generated for Hamiltonian Bipartite graphs of even orders and regular degree while the catalogs of LDPC codes are created for both the regular and irregular degrees.

According to an embodiment herein, a system and method are provided for generating Hamiltonian Bipartite graphs with a higher value of even girths greater than 6 and with higher values of even girth up to 16 and above.

According to an embodiment herein, a system and method are provided for generating Hamiltonian Bipartite graphs for various symmetry factors of b for orders of 2m such that m is a multiple of b.

Figure 4:
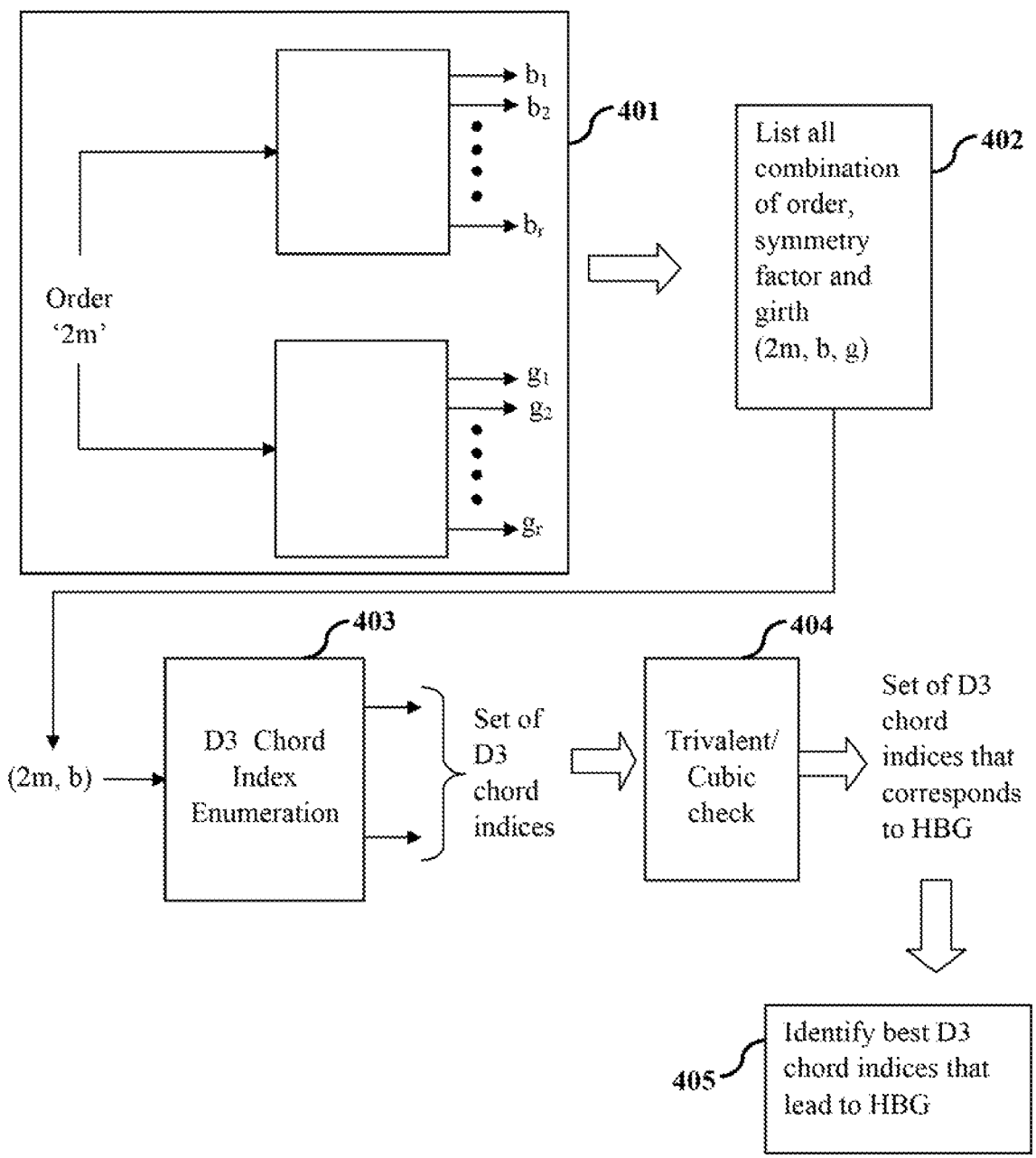
FIG. 4 illustrates a process flow chart for generating (3, g) Hamiltonian Bipartite graphs by a graph creation module, in accordance with an embodiment herein.

FIG. 4 illustrates a process flow for generating (3, g) Hamiltonian Bipartite graphs by a graph creation module, in accordance with an embodiment herein. For generating the (3, g) Hamiltonian Bipartite graphs (HBG), the best D3 chord indices that leads to (3, g) HBG are identified. The D3 chord indices are used to describe the (3, g) HBG. The (3, g) HBG generated are used for creating the LDPC codes of high quality. The LDPC codes are created using well known techniques from graphs of high girth.

The process includes receiving user input regarding graph parameters through a user interface on a computing device. Further, HBG are generated through a graph creation module. Initially, at step 401, a set of even girths $g_1, g_2 \ldots g_n$ that could possibly exist (based on existing knowledge in graph theory such as lower and upper bounds obtained from Exoo G. and Jajcay R. *Dynamic cage survey. Electronic Journal of Combinatorics,* 18(DS16), 2011) for a given order '2m' are listed. Further, for each order '2m', the number of possible symmetry factors $b_1, b_2 \ldots, b_r$, are listed. The symmetry factors $b_1, b_2 \ldots, b_r$, are listed such that each symmetry factor divides m. For example consider that the order is '60', then the possible symmetry factors $b_1, b_2 \ldots, b_r$ would be 2, 3, 5, 6, and 15. At step 402, after identifying the set of even girths $g_1, g_2 \ldots g_n$ and number of possible symmetry factors $b_1, b_2 \ldots, b_r$, all combination of order, symmetry factor and girth (2m, b, g) are listed.

At step 403, for each combination of order and symmetry factor (2m, b), D3 chord index enumeration is performed. For each combination of order and symmetry factor (2m, b), the possible set of D3 chord indices are listed out. At step 404, each D3 chord index listed for each combination of order and symmetry factor (2m, b) are provided for a trivalent or cubic check. In the trivalent or cubic check, each D3 chord index that does not correspond to a trivalent/cubic graph is removed from the list. For each combination of order and symmetry factor (2m, b), the set of D3 chord indices that corresponds to the trivalent/cubic HBG are listed out. At step 405, the D3 chord indices that leads to (3, g) HBG are identified. In order to identify the D3 chord indices that leads to (3, g) HBG, girth of constructed graph for each D3 chord index is checked and at least one graph for each combination of order, symmetry factor and girth (2m, b, g) is listed.

Therefore, the various embodiments herein provide a method and system for generating a catalog of graphs that acts as a source for creating error correcting codes.

The embodiments herein provides a catalog of (3, g) Hamiltonian Bipartite graphs as a source for creating error-correcting codes.

The embodiments herein provides a system and method to generate a catalog of (3, g) graph for even girth g, which is used for creation of the error-correction codes.

The embodiments herein provide a new source of graphs that dramatically increases the supply of graphs of high girth.

The embodiments herein provide a list of number of graphs of high girth, given that the number of non-isomorphic trivalent graphs for orders greater than 32 is extremely large.

The embodiments herein provide a system and method to ease the process of finding the trivalent graphs of large girth.

The embodiments herein provides a listing of graphs including the smallest known (3, g) graphs.

The embodiments herein provide a system and method to analyse the resulting graph list.

The embodiments herein provides a system and method for generating Hamiltonian Bipartite graphs with a higher value of even girths greater than 6 and with higher values of even girth up to 16 and above.

The embodiments herein provides a system and method for generating Hamiltonian Bipartite graphs for various symmetry factors of b for orders of 2m such that m is a multiple of b.

The foregoing description of the specific embodiments will so fully reveal the general nature of the embodiments herein that others can, by applying current knowledge, readily modify and/or adapt for various applications such as specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modifications. However, all such modifications are deemed to be within the scope of the claims.

What is claimed is:

1. A system comprising hardware processor and memory stored with a plurality of instructions that are run on the hardware processor for generating a catalog of LDPC codes through one or more applications or algorithms, for creating error correction codes in communication systems, the system comprising:

a user interface configured to receive a plurality of details of a graph system, and wherein the user interface is configured to receive the plurality of graph parameters through a computing device;

a hardware processor coupled to the user interface for generating graphs based on user inputs using one or more applications or algorithms;

a graph creation module loaded with instructions that are run on the hardware processor and configured to generate (3, g) Hamiltonian Bipartite graphs of specified even girth, and graphs with larger number of orders and larger girths through one or more applications or algorithms;

a table creation module loaded with instructions that are run on the hardware processor and configured to create a table of (3, g) Hamiltonian Bipartite graphs for a symmetry factor b, for different orders through an application or algorithm;

a catalog creation module loaded with instructions that are run on the hardware processor and configured to generate a catalog of (3, g) Hamiltonian Bipartite graphs including a plurality of tables for various orders through an application or algorithm;

a LDPC generation module loaded with instructions that are run on the hardware processor and configured to generates a catalog of LDPC codes from a catalog of (3, g) Hamiltonian Bipartite graphs through an application or algorithm; and a database coupled to at least one of the graph creation module, the table creation module, the catalog creation module, and the LDPC generation module, and configured for storing a plurality of details of the graph system and the catalog of generated graphs, and the catalog of the LDPC codes;

wherein the graph creation module is further configured to generate smallest known (3, g) graph for even a specified girth through an application or algorithm, and wherein the graph creation module is configured to generate a list (3, g) graphs for even a girth g to provide graphs that are not-vertex transitive for many orders through an application or algorithm, and wherein the hardware processor is configured for creation of the error-correction codes through an application or algorithm using the catalogue of (3, g) graph for even girth g as a source, for correcting errors introduced during data transmission from a source to receiver in a communication channel to enable delivery of digital data over unreliable communication channels and to enable reconstruction of original data sent and wherein the error correction codes are implemented in communication systems to remove errors introduced during a transmission from a source to receiver due to channel noise.

2. The system according to claim 1, wherein the graph generation module is further configured for representing an infinite family of Hamiltonian Bipartite graphs of regular degree with D3 chord index notation through an application or algorithm.

3. The system according to claim 1, wherein the table creation module is configured to generate the tables including lists of (3, g) Hamiltonian Bipartite graphs that are exhaustive with graphs for each order in specified range through an application or algorithm.

4. A computer implemented method comprising instructions stored on a non-transitory computer-readable storage medium and executed on a computing device provided with a hardware processor and a memory for generating a catalog of LDPC codes through one or more applications or algorithms, for creating error correction codes in communication systems, the method comprising the steps of:

receiving a plurality of details of a graph through a user interface of a computing device, wherein the plurality of graph parameters are received through a computing device; generating (3, g) Hamiltonian Bipartite graphs of specified even girth, and graphs with larger number of orders and larger girths through a graph creation module through one or more applications or algorithms;

generating a table of (3, g) Hamiltonian Bipartite graphs for a symmetry factor b, for different orders through a table creation module through an application or algorithm;

generating a catalog of (3, g) Hamiltonian Bipartite graphs including a plurality of tables for various orders through a catalog creation module through an application or algorithm; generating a catalog of LDPC codes from a catalog of (3, g) Hamiltonian Bipartite graphs through of LDPC generation module through an application or algorithm; and storing a plurality of details of the graph system and the catalog of generated graphs, and the catalog of the LDPC codes in a database;

wherein the graph creation module is further configured to generate smallest known (3, g) graph for even a specified girth through an application or algorithm, and wherein the graph creation module of configured to generate a list of (3, g) graphs for even a girth g to provide graphs that are not-vertex transitive for many orders through an application or algorithm, and wherein the catalogue of (3, g) graph for even girth g, is used a source for creation of the error-correction codes by the hardware processor through an application or algorithm for correcting errors introduced during data transmission from a source to receiver in a communication channel to enable delivery of digital data over unreliable communication channels and to enable reconstruction of original data sent, and wherein the error correction codes are implemented in communication systems to remove errors introduced during a transmission from a source to receiver due to channel noise.

* * * * *